United States Patent
Chou (10) Patent No.: US 7,492,847 B2
(45) Date of Patent: Feb. 17, 2009

(54) ANALOG FRONT END CIRCUIT WITH AUTOMATIC SAMPLING TIME GENERATION SYSTEM AND METHOD

(75) Inventor: Kuo-Yu Chou, HsinChu (TW)

(73) Assignee: Novatek Microelectronics Corp., Hsinchu (TW)

( * ) Notice: Subject to any disclaimer, the term of this patent is extended or adjusted under 35 U.S.C. 154(b) by 691 days.

(21) Appl. No.: 10/923,670

(22) Filed: Aug. 24, 2004

(65) Prior Publication Data
US 2006/0045225 A1 Mar. 2, 2006

(30) Foreign Application Priority Data
Apr. 5, 2004 (TW) ............................... 93112551 A (51) Int. Cl.
*H04L 7/00* (2006.01)

(52) U.S. Cl. ...................... 375/355; 375/294; 341/122; 341/139; 358/313.17; 358/209; 358/213.13

(58) Field of Classification Search ................. 375/355, 375/294; 341/122, 139; 358/213.17, 209, 358/213.13
See application file for complete search history.

(56) References Cited

U.S. PATENT DOCUMENTS

| 5,095,368 A * | 3/1992 | Miyakawa et al. ........... 348/247 |
| 2003/0218483 A1 * | 11/2003 | Yoshioka ..................... 327/156 |
| 2004/0008388 A1 * | 1/2004 | Tanaka ........................ 358/513 |

* cited by examiner

*Primary Examiner*—Shuwang Liu
*Assistant Examiner*—Helene Tayong
(74) *Attorney, Agent, or Firm*—Jianq Chyun IP Office (57) ABSTRACT

An automatic clock generation system is used for automatically outputting a sampling signal and a holding signal to an analog front end circuit and for sampling the analog signal. The clock generation system comprises a clock generator generating a plurality of clock signals and a comparing module. According to the plurality of clock signals, the comparing module compares the analog signal with a first reference signal and outputs a first comparison signal. The comparing module further compares the digital signal outputted by the analog front end circuit with a second reference signal and outputs a second comparison signal. The clock generator selectively outputs a first clock signal, corresponding to the first comparison signal, of the plurality of clock signals as the sampling signal when the first comparison signal received by the clock generator is at a high state. The clock generator further selectively outputs a second clock signal, corresponding to the second comparison signal, of the plurality of clock signals as the holding signal when the second comparison signal received by the clock generator is at the high state.

17 Claims, 8 Drawing Sheets

FIG.8

ANALOG FRONT END CIRCUIT WITH AUTOMATIC SAMPLING TIME GENERATION SYSTEM AND METHOD

BACKGROUND OF THE INVENTION

1. Field of the Invention

This present invention relates to an automatic sampling clock generation system; it is especially about a clock generation system for automatically generating a sampling signal and a holding signal to an analog front end circuit.

2. Description of the Prior Art

Because the outputting signal of general image sensors periodically contains a level signal and a reference signal, an analog front end circuit usually utilizes the format of the correlated double sampling to sample the outputting signal of the image sensor; it also amplifies and transforms the result into a digital signal for the follow-up element processing.

Figure 1:
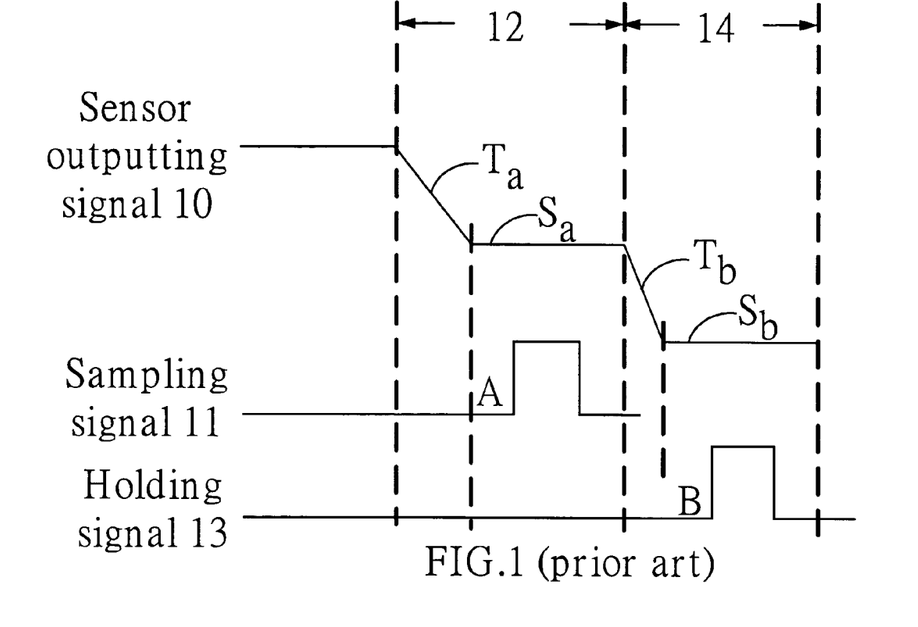
FIG. 1 is the working diagram of a sensor outputting signal, a sampling clock signal, and a holding clock signal of the prior art.

Referring to the system shown in FIG. 1, FIG. 1 is a working diagram of a sensor outputting signal 10, a sampling clock signal 11, and a holding clock signal 13 of the prior art. Sensor outputting signal 10 of the sensor periodically includes a reference signal 12 and an level signal 14. Due to the fact that the reference signal 12 and level signal 14 are not considerably smooth, it includes a transition state Ta, Tb and a steady state Sa, Sb; because it can only sample the reference signal 12 and level signal 14 in the steady state Sa, Sb, the available part for sampling is considerably narrow. In the prior art, in order to avoid having sampling errors, the location of sampling work must be distant from the transition state Ta, Tb; usually, half of the width of the steady state Sa of the reference signal 12 is taken as the duty cycle A of the sampling clock signal 11, and half of the width of the steady state Sb of the level signal 14 is taken as the duty cycle B of the holding clock signal 13. Therefore, the width of the duty cycle A of the sampling clock signal 11 and the duty cycle B of the holding clock signal 13 are very narrow.

In addition, the synchronization state of the sampling clock signal 11 or the holding clock signal 13 and the sensor outputting signal 10 also affects the quality of the sampling work; if the steady states Sa of the sampling clock signal 11 and the reference signal 12 are not synchronized, or if the holding clock signal and the level signal 14 are not synchronized, it will result in sampling errors and will affect the quality of the image.

The analog front end circuit of the prior art utilizes a register to store the adjusting finish parameter used in the process of producing terminal products (e.g. digital camera, digital video camera); the parameter controls a delay lock loop to suitably generate the sampling clock signal 11 and holding clock signal 13. However, the register can only store the invariable parameter; when there are changed in the external environmental factors, such as temperature, humidity, or voltage, these changes may cause errors in the sensor outputting signal 10, the sampling clock signal 11, and the holding clock signal 13 that were outputted by the sensor, and it may even cause an asynchronous situation. Therefore, the analog front end circuit of the prior art can not accurately adjust the sampling clock signal 11 and the holding clock signal 13 as errors in signal sampling may occur, and the quality of the image may be affected.

Moreover, as there are increasing demands in the function requirements of an image collecting apparatus, such as 4 continuous shootings in high speed, 8 continuous shootings, even multiple continuous shootings in much higher speed, and the function of shutter chance, in order to accelerate the speed of the image data processing to increase the number of processing data of a unit time, it will probably satisfy the requirement by shortening the width of the steady state Sa of the reference signal 12 and the steady state Sb of the level signal 14. Therefore, it makes the synchronism request of the sampling clock signal 11, the holding clock signal 13, and the sensor outputting signal 10 more strict and demanding.

Therefore, the main objective of this invention is to provide an automatic sampling clock generation system and method to overcome the above problems.

SUMMARY OF THE INVENTION

One of the objectives of this invention is to provide an automatic clock generation system and method for automatically outputting a sampling signal and a holding signal to an analog front end circuit; it can quickly find the suitable clock signal for different image sensors, and the automatic clock generation system can also automatically adjust the sampling clock signal and the holding clock signal when the external environment is changed.

The clock generation system of the present invention is used for automatically generating a sampling signal and a holding signal to an analog front end circuit; the analog front end circuit transforms an analog signal outputted from an image sensor into a digital signal according to the sampling signal and the holding signal. The clock generation system comprises a clock generator and a comparing module.

The clock generator generates a plurality of clock signals according to a reference signal. The comparing module receives the plurality of clock signals, compares the analog signal with a first reference signal, and outputs a first comparison signal. The comparing module further receives the plurality of clock signals, compares the digital signal with a second reference signal, and outputs a second comparison signal.

The clock generator selectively outputs a first clock signal, corresponding to the first comparison signal, of the plurality of clock signals as the sampling signal when the first comparison signal received by the clock generator is at a high state. The clock generator further selectively outputs a second clock signal, corresponding to the second comparison signal, of the plurality of clock signals as the holding signal when the second comparison signal received by the clock generator is at the high state.

The automatic sampling clock generation system of the present invention adds the automatic sampling clock generation system into the analog front end circuit; in this way, it can quickly find the suitable sampling clock in each of the different environments, and the automatic sampling clock generation system can automatically adjust the clock accurately when the environment is changed. Therefore, the adjusting time of different image sensors or products is shortened, and the speed of producing the product, made by utilizing the automatic sampling clock generation system to automatically adjust the sampling clock signal and holding clock signal, is accelerated. At the same time, the effects of external environmental factors, such as temperature, voltage . . . etc. on the image sensor can be overcome, and the reliability of the system is increased.

The advantage and spirit of the invention may be understood by the following recitations together with the appended drawings.

DETAILED DESCRIPTION OF THE INVENTION

Figure 2:
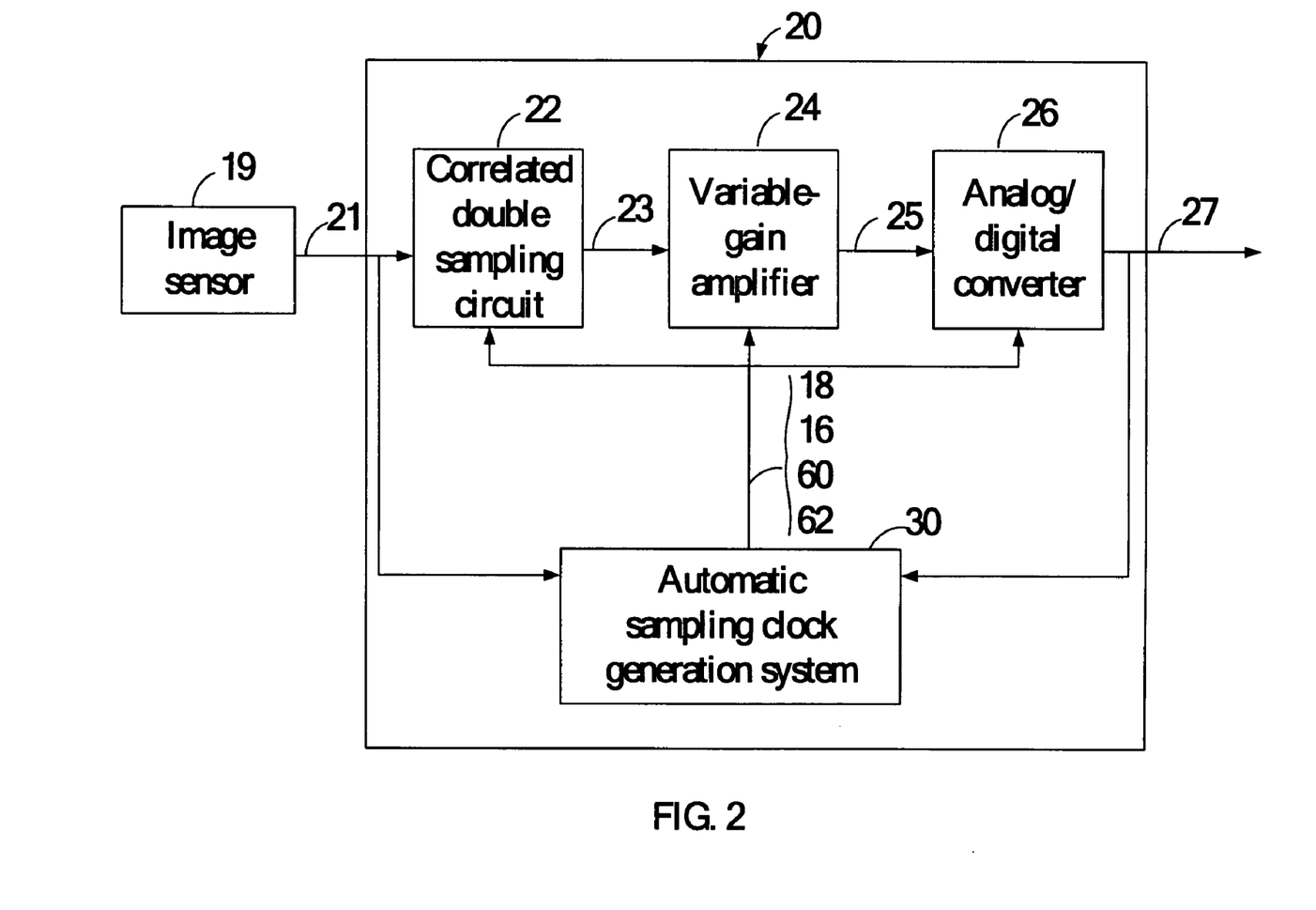
FIG. 2 is a system block diagram of an automatic sampling clock generation system used for an analog front end circuit.

Referring to FIG. 2, FIG. 2 is a system block diagram of the automatic sampling clock generation system 30 used in an analog front end circuit 20. The automatic sampling clock generation system 30 is used for automatically generating a sampling signal 16 and a holding signal 18 to an analog front end circuit 20. The analog front-end circuit 20 transforms an analog signal 21 outputted from an image sensor 19 into a digital signal 27 according to the sampling signal 16 and the holding signal 18 of the automatic sampling clock generation system 30. The analog front end circuit 20 comprises a correlated double sampling circuit 22, a variable-gain amplifier 24, and an analog/digital converter 26.

Referring to FIG. 1 and FIG. 2, the outputted analog signal 21 of the image sensor 19 periodically contains an level signal 14 and a reference signal 12. A correlated double sampling circuit 22 generates a processing signal 23 by utilizing the sampling signal 16 and the holding signal 18 of the automatic sampling clock generation system 30 to respectively sample the reference signal 12 and the level signal 14. In different embodiments, the image sensor 19 can be a charge coupled device sensor or a CMOS sensor.

The variable-gain amplifier 24 amplifies and operates on the processing signal 23 and generates an amplification gain signal 25. In one embodiment, the processing signal 23 contains an level clock sampling signal (not shown) and a reference clock sampling signal (not shown); the variable-gain amplifier 24 operates a subtraction on the level clock sampling signal and the reference clock sampling signal, and it then amplifies the difference to generate an amplification gain signal 25. The analog/digital converter 26 receives the amplification gain signal 25 and transforms the amplification gain signal 25 into the digital signal 27 for later processing.

Figure 3:
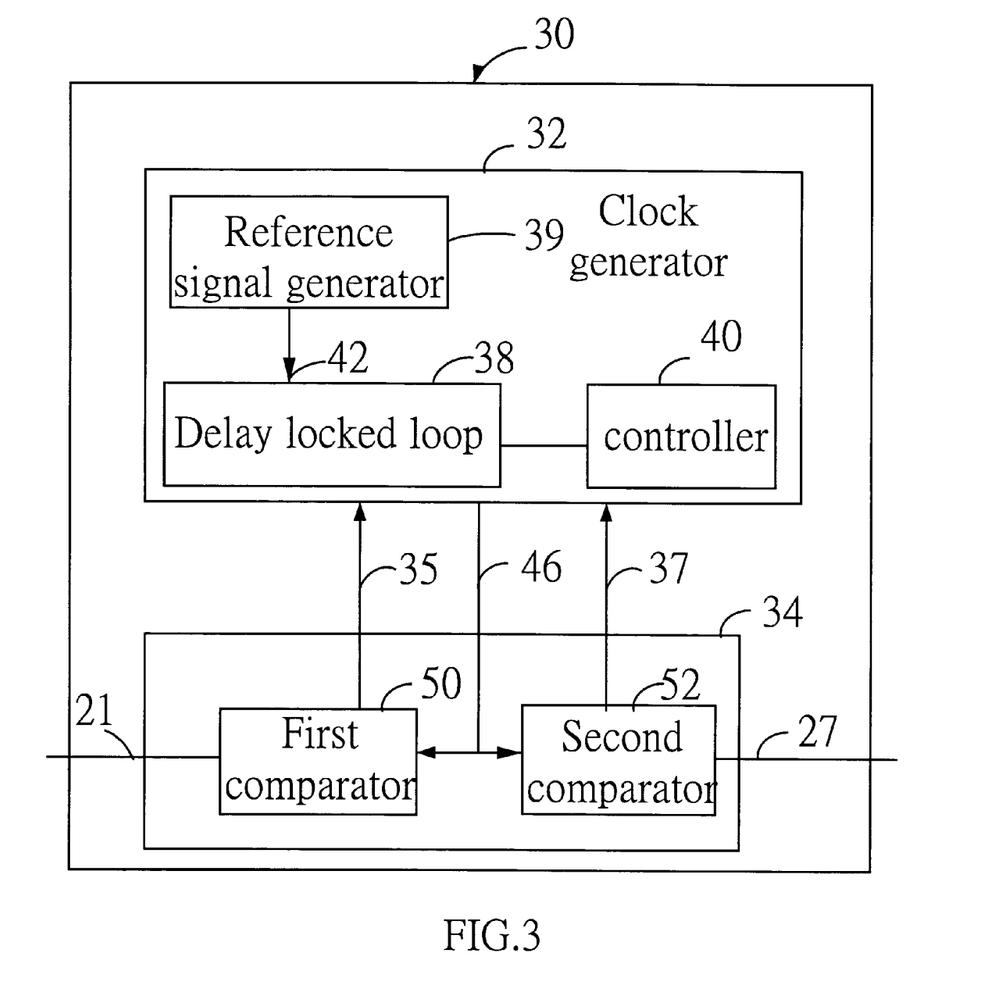
FIG. 3 is a system block diagram of the automatic sampling clock generation system.
Figure 4:
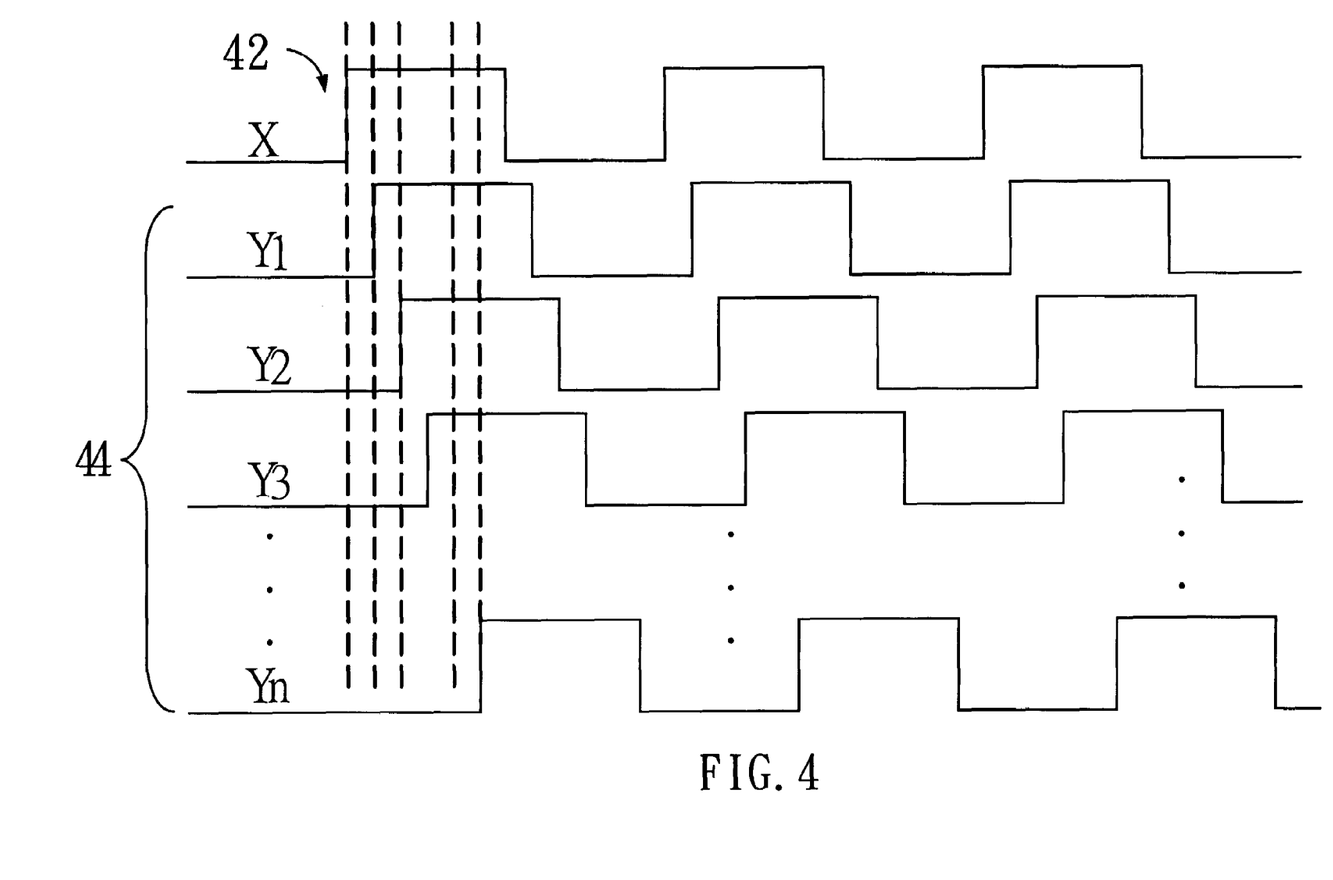
FIG. 4 is a diagram of the reference signal and delay signal of an automatic sampling clock generation system of FIG. 3.
Figure 5:
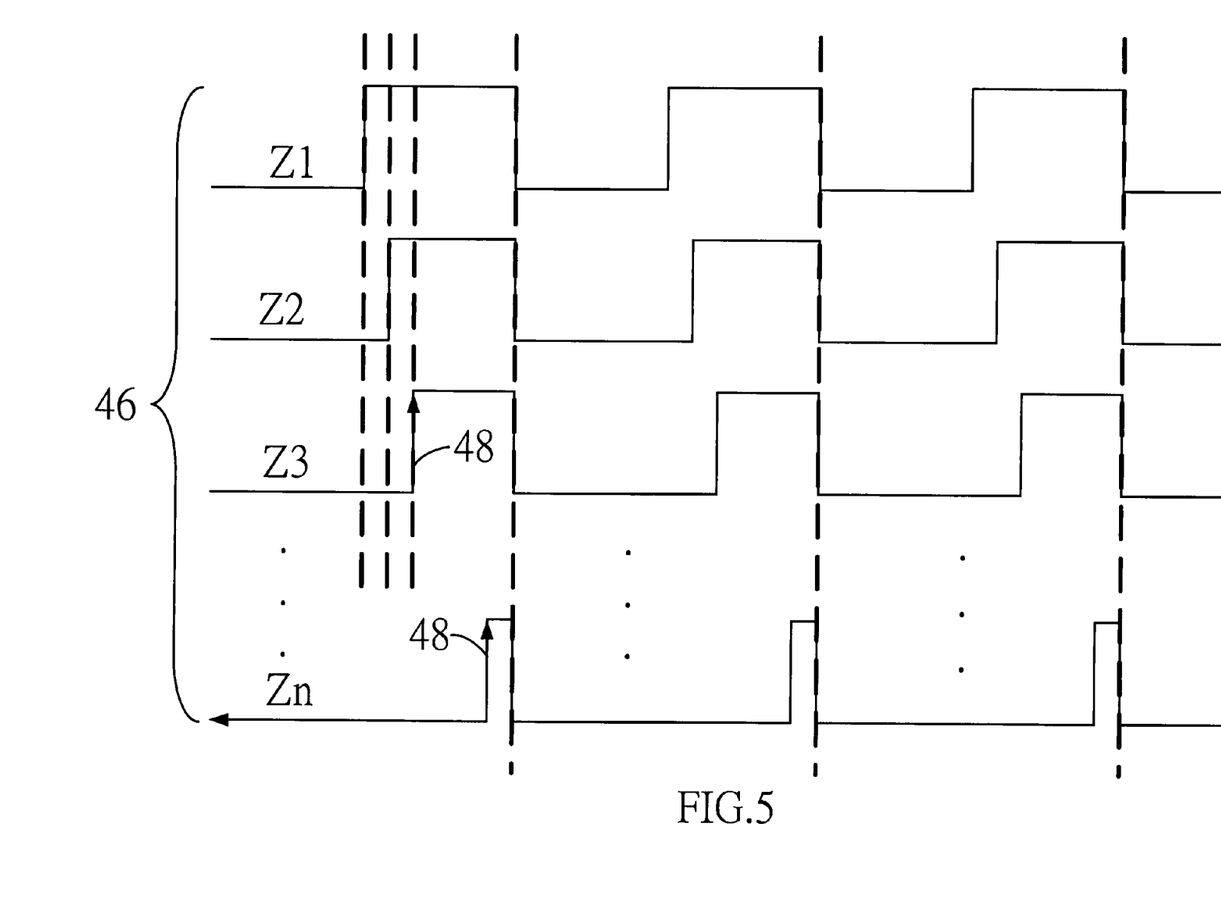
FIG. 5 is a diagram of the clock signal generated by the logic operation of the controller of FIG. 3.

Referring to FIG. 3 through FIG. 5, FIG. 3 is a system block diagram of the automatic sampling clock generation system 30. FIG. 4 is a diagram of the reference signal 42 and the delay signal 44 of the automatic sampling clock generation system 30 of FIG. 3. FIG. 5 is a diagram of the clock signal 46 generated by the logic operation of the controller 40 of FIG. 3. As shown in FIG. 3, the automatic sampling clock generation system 30 of the present invention comprises a clock generator 32 and a comparing module 34. The clock generator 32 comprises a delay locked loop 38, a clock generator 39, and a controller 40. The comparing module 34 further comprises a first comparator 50 and a second comparator 52.

The delay locked loop 38 generates a plurality of delay signals 44 according to the reference signal 42 generated by the reference signal generator 39. As shown in FIG. 4, the reference signal 42 is shown as X; a plurality of delay signals 44 are shown as Y1Y2Y3Yn. The period of the reference signal 42 is the same as the period of each of the plurality of delay signals 44, and there is a predetermined phase difference between each of the plurality of delay signals 44 and the reference signal 42. The controller 40 generates a plurality of clock signals 46 by performing a logic operation on the reference signal 42 and the plurality of delay signals 44 according to the reference signal 42 and the plurality of delay signals 44. As shown in FIG. 5, the plurality of clock signals 46 is shown as Z1Z2Z3 Zn. Each of the plurality of clock signals 46(Z1Z2Z3Zn) has a different phase value.

In this embodiment, the logic operation of the controller 40 is a dot operation; it generates a plurality of clock signals 46 by performing the dot operation on the reference signal 42 and the plurality of delay signals 44. As shown in FIG. 4 and FIG. 5, the reference signal 42(X) and each of the plurality of delay signals 44(Y1Y2Y3Yn) being operated in the dot operation will result in a plurality of clock signals 46(Z1Z2Z3 Zn). Because using the dot operation in signals will cause the intersection of two signals, the duty cycle will decrease; in other words, the signal width will be narrower, and each of the plurality of clock signals has a different phase value.

As shown in FIG. 3, the controller 40 outputs the plurality of clock signals 46 to the first comparator 50 step by step according to predetermined outputting period. In an embodiment, after the controller 40 outputs 50 periods of Z1 step by step, it outputs 50 periods of Z2, and then each of the clock signals 46 is outputted to the first comparator 50 step by step. Furthermore, the first comparator 50 compares the analog signal 21 with a first signal 54 according to the positive 48 of the clock signal 46, and then it outputs a first comparison signal 35; the first comparator 50 outputs a first comparison signal 35 of the first predetermined level value when the level value of the analog signal 21 is the same as the level value of the first signal 54. In this embodiment, the first predetermined level value is at a high state. The clock generator 32 selectively outputs a first clock signal, which corresponds to the high state of the first comparison signal, of the plurality of clock signals 46 as the sampling signal 60 when the clock generator 32 receives the first comparison signal 35 at a high state.

Moreover, the analog front end circuit 20 samples an analog signal 21 to generate a digital signal 27 according to the sampling signal 60 and the holding signal 18. The second comparator 52 receives the plurality of clock signals 46 and compares the digital signal 27 with the second signal 57 according to the positive 48 of the clock signal 47, so as to output a second comparison signal 37. The second comparator 52 outputs a second comparison signal 37 of the second predetermined level value when the level value of the digital signal 27 is the same as the level value of the second signal 57; in this embodiment, the second predetermined level value is at a high state. The clock generator 32 selectively outputs a second clock signal, which corresponds to the second comparison signal, of the plurality of clock signals 46 as the holding signal 62 when the second comparison signal 37 is at a high state.

The level value of the first signal 54 is the same as the level value of a reference signal 12 generated by the image sensor 19; in an embodiment, the level of the reference signal 12 is 1.5V. The second signal 57 is a digital level signal of the digital signal 27 corresponding to a black pixel of the image sensor 19, in which the level of the digital level signal is about 20 mV. The second signal 57 is a digital level signal of the digital signal 27 corresponding to a dummy pixel of the image sensor.

Therefore, the automatic sampling clock generation system 30 of the present invention can automatically generate the sampling signal 60 and the holding signal 62 suitably; the system can be designed to automatically generate the sampling signal 60 and the holding signal 62 suitably whenever the system is started, so as to overcome the problem of the prior art, of which the sensor outputting signal 10, the sampling clock signal 11, and the holding clock signal 13 become not synchronized when the external environmental factors change.

In another embodiment, the first signal 54 includes a first A level signal 55 and a first B level signal 56; the first comparator 50 outputs a high state of the first comparison signal 35 when the level value of the analog signal 21 is between the first A level signal 55 and the first B level signal 56.

In another embodiment, the second signal 57 includes a second A level signal 58 and a second B level signal 59; the second comparator 52 outputs a high state of the second comparison signal 37 when the level value of the digital signal 27 is between the second A level signal 58 and the second B level signal 59.

Figure 6:
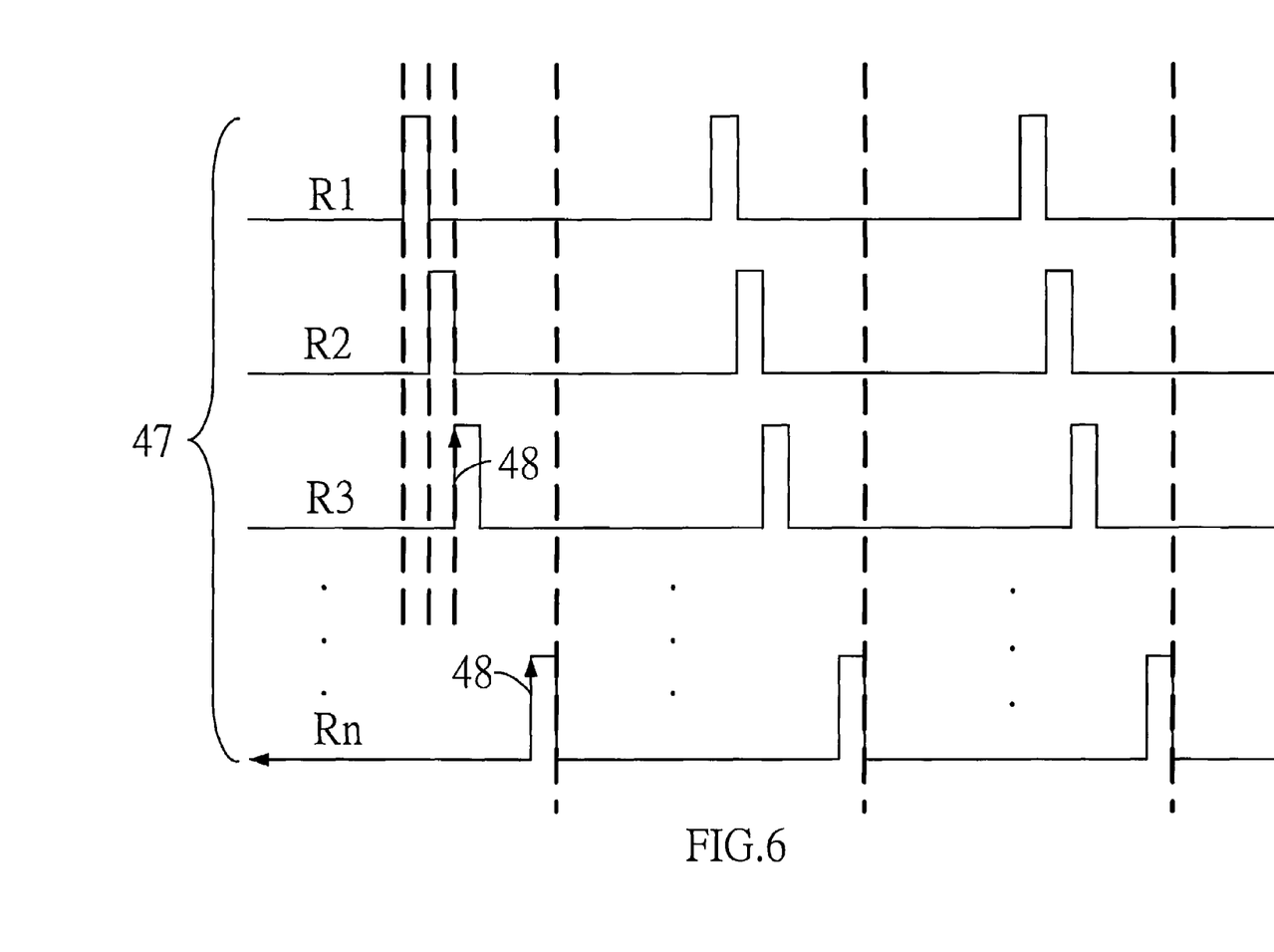
FIG. 6 is a clock signal diagram of the other concretion embodiment of the logic operation of the automatic sampling clock generation system.

Referring to FIG. 3, FIG. 4 and FIG. 6, FIG. 6 is a clock signal diagram of the other concretion embodiment of the logic operation of the automatic sampling clock generation system. In this embodiment, the logic operation of the controller 40 is an opposite operation and a dot operation; the collector 40 chooses a first signal (not shown) and a second signal (not shown) from the reference signal 42 and the plurality of the delay signals 44. After an opposite operation is operated on the second signal, a dot operation is operated on the first signal and the opposite of the second signal, and a plurality of the clock signals 47 are generated. As shown in FIG. 4 and FIG. 6, the first signal and the second signal are chosen step by step from the reference signal 42(X) and the plurality of the delay signals 44(Y1Y2Y3Yn), and the opposite operation and the dot operation are performed; the clock signals 47(R1R2R3Rn) are then obtained. For example, the reference signal 42(X) is chosen as the first signal, and the delay signal 44(Y1) is chosen as the second signal; then, the opposite operation and the dot operation are performed on the signals, and the clock signals 47(R1) are then obtained. When the delay signal 44(Y1) is chosen as the first signal, and the delay signal 44(Y2) is chosen as the second signal, the opposite operation and the dot operation are then performed on the signals, and the clock signals 47(R2) are obtained. When the delay signal 44(Y2) is chosen as the first signal, and the delay signal 44(Y3) is chosen as the second signal, the opposite operation and the dot operation are performed on the signals, and the clock signals 47(R3) are obtained . . . etc.

As shown in FIG. 3, the controller 40 outputs the plurality of clock signals 47 to the first comparator 50 step by step according to the predetermined outputting period. The first comparator 50 compares the analog signal 21 with a first signal 54 according to the positive 48 of the clock signal 47, and a first comparison signal 35 is outputted; the first comparator 50 outputs a high state of the first comparison signal 35 when the level value of the analog signal 21 is the same as the level value of the first signal 54. The clock generator 32 selectively outputs a first clock signal, which corresponds to the first comparison signal, of the plurality of clock signals 46 as the sampling signal 60 when the clock generator 32 receives the first comparison signal 35 at a high state.

Furthermore, the analog front end circuit 20 samples an analog signal 21 to generate a digital signal 27 according to the sampling signal 60 and the holding signal 18; the second comparator 52 receives a plurality of clock signals 47, and the digital signal 27 is compared with the second signal 57 according to the positive 48 of the clock signal 47, so as to output a second comparison signal 37. The second comparator 52 outputs a high state of the second comparison signal 37 when the level value of the digital signal 27 is the same as the level value of the second signal 57. The clock generator 32 selectively outputs a second clock signal, which corresponds to the second comparison signal, of the plurality of clock signals 46 as the holding signal 62 when the second comparison signal 37 is at a high state.

Figure 7:
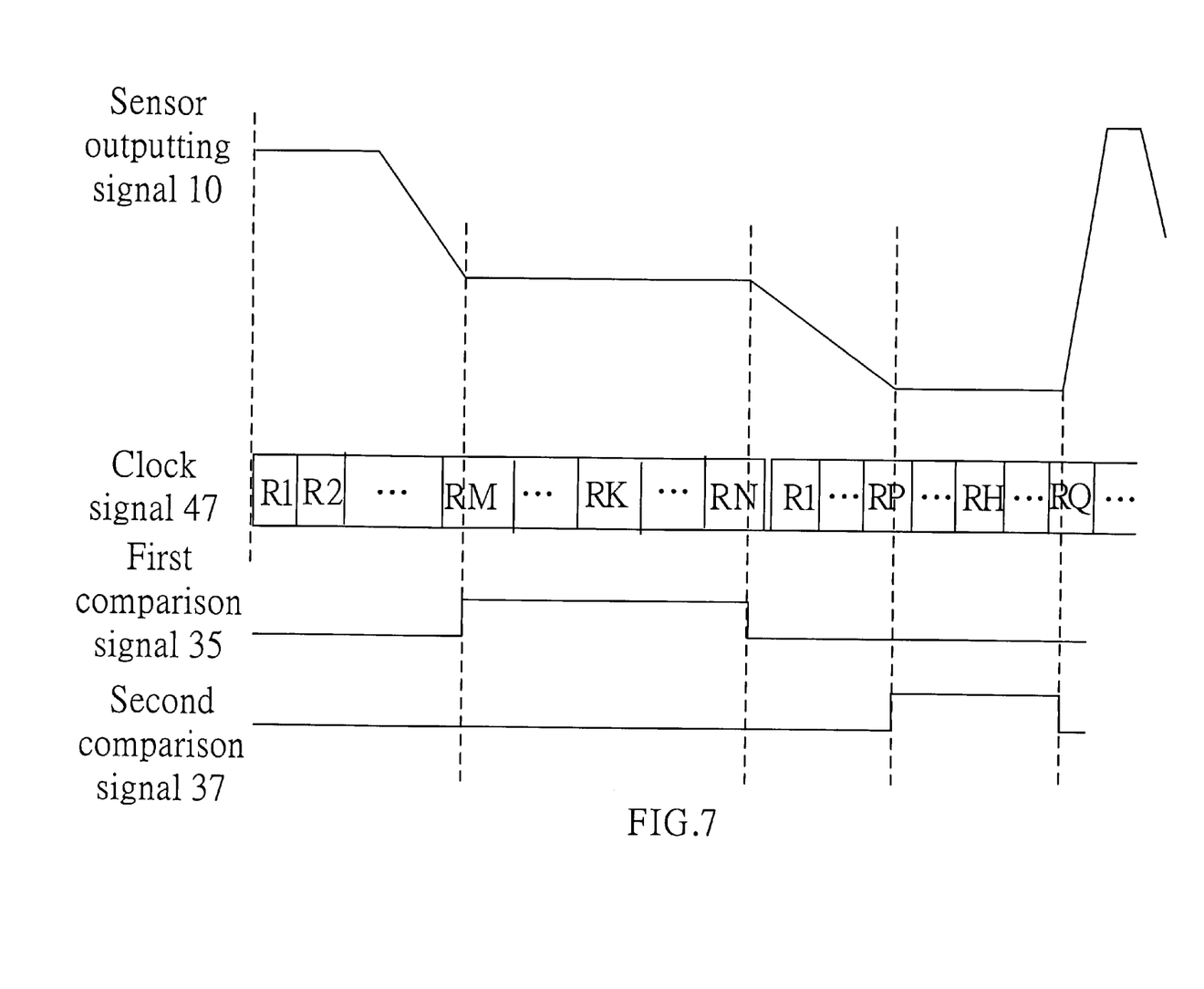
FIG. 7 is a diagram of the signal outputted by the sensor and the clock signal of the invention.

In another embodiment, as shown in FIG. 3 and FIG. 7, FIG. 7 is a diagram of the signal 10 outputted by sensor and the clock signal 47 of the present invention. The controller 40 outputs the plurality of the clock signals 47 to the first comparator 50 step by step according to a predetermined outputting period. Moreover, the first comparator 50 compares the analog signal 21 with the first signal 54 according to the positive 48 of the clock signal 47 to output a first comparison signal 35; the first comparator 50 outputs a high state of the first comparison signal 35 when the level value of the analog signal 21 is the same as the level value of the first signal 54.

The clock generator 32 records the plurality of clock signals 46, corresponding to a first A clock signal RM of the high state of the first comparison signal when the clock generator 32 receives a high state of the first comparison signal 35, and the clock generator 32 further records the plurality of clock signals 46, corresponding to a first B clock signal RN of the low state of the first comparison signal when the clock generator 32 receives a low state of the first comparison signal 35. Moreover, the controller 40 outputs a first C clock signal RK, which is broadly located in the middle of the first A clock signal RM and the first B clock signal RN, as the sampling clock signal 60 according to the record of the first A clock signal RM and the first B clock signal RN.

Furthermore, the analog front end circuit 20 samples an analog signal 21 to generate a digital signal 27 according to the sampling signal 60 and the holding signal 18. The digital signal 27 is compared with the second signal 57 according to the positive 48 of the clock signal 47 to output a second comparison signal 37; the second comparator 52 outputs a high state of the second comparison signal 37 when the level value of the digital signal 27 is the same as the level value of the second signal 57.

The clock generator 32 records the plurality of clock signals 47, corresponding to a second A clock signal RP of the high state of the second comparison signal 37 when the clock generator 32 receives a high state of the second comparison signal 37, and the clock generator 32 further records the plurality of clock signals 46, corresponding to a second B clock signal RQ of the high state of the second comparison signal when the clock generator 32 receives a low state of the second comparison signal 37. Moreover, the controller 40 outputs a second C clock signal RH, which is broadly located in the middle of the second A clock signal RP and the second B clock signal RQ, as the holding clock signal 62 according to the record of the second A clock signal RP and the second B clock signal RQ.

In another embodiment, the first C clock signal RK is a result from performing the opposite operation and the dot operation on the delay signal 44(Y(K−1)) and the delay signal 44(YK). The controller 40 suitably selects two of the delay signals 44, such as the delay signal 44(Y(K−3)) and the delay signal 44(Y(K+2)), according to the first C clock signal RK, and it obtains the third clock signal with a wider pulse wave width which is a result from performing the opposite operation and the dot operation; the third clock signal is then outputted as the sampling clock signal 64.

In another embodiment, the second C clock signal RH is a result from performing the opposite operation and the dot operation on the delay signal 44(Y(H−1)) and the delay signal 44(YH). The controller 40 suitably selects two of the delay signals 44, such as the delay signal 44(Y(H−3)) and the delay signal 44(Y(H+2)), according to the second C clock signal RH, and it obtains the fourth clock signal with a wider pulse wave width which is a result from performing the opposite operation and the dot operation; the fourth clock signal is then outputted as the holding clock signal 66.

In another embodiment, a transforming circuit, such as the coupling capacitor, transforms the original analog signal (not shown) into the analog signal 21 to be suitably entered into the analog front end circuit 20.

Figure 8:
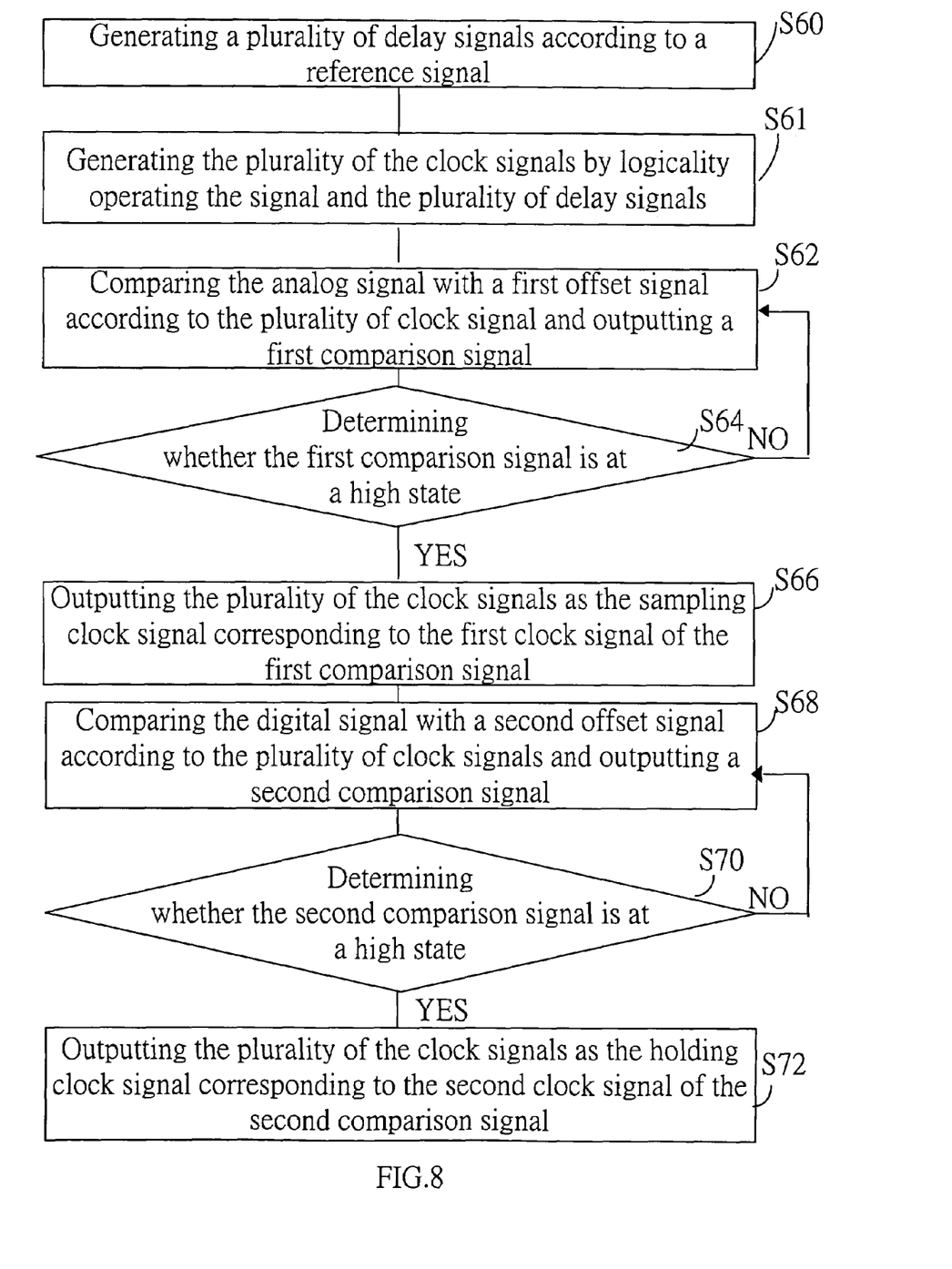
FIG. 8 is a flow chart of the automatic sampling clock generation system.

Referring to FIG. 8, FIG. 8 is a flow chart of the automatic sampling clock generation system. The present invention is a clock generation method for automatically outputting a sampling signal and a holding signal to an analog front end circuit according to the sampling signal and the holding signal. The analog front end circuit transforms an analog signal outputted by an image sensor into a digital signal according to the sampling signal and the holding signal. In one of the embodiments, the analog front end circuit can be the analog front end circuit 20 as shown in FIG. 2.

The clock generation method comprises the steps of:

S60: Generate a plurality of delay signals according to a reference signal.

S61: Generate the plurality of clock signals by logicality operating on the reference signal and the plurality of delay signals.

S62: Compare the analog signal with a first level signal according to the plurality of clock signals, and outputs a first comparison signal.

S64: Determine whether the first comparison signal is at a high state. If the answer is YES, go to step S66; if the answer is NO, go back to step S62.

S66: Output the plurality of clock signals as the sampling clock signal corresponding to the first clock signal of the first comparison signal.

S68: Compare the digital signal with a second level signal according to the plurality of clock signals, and outputs a second comparison signal.

S70: Determine whether the second comparison signal is at a high state. If the answer is YES, go to step S72; if the answer is NO, go back to step S68.

S72: Output the plurality of clock signals as the holding clock signal corresponding to the second clock signal of the second comparison signal.

The automatic sampling clock generator selectively outputs a first clock signal as the sampling signal when the first comparison signal is at a first predetermined level level; the clock generator further selectively outputs a second clock signal as the holding signal when the second comparison signal is at a second predetermined level level.

The automatic sampling clock generation system of this invention can find the suitable sampling clock quickly in each of the different environments, and the automatic sampling clock generation system can automatically adjust the clock accurately when the environment is changed, and errors will not be caused by changes in the external environment. Therefore, the adjusting time of different image sensors or products can be shortened, and the speed of making the product can be accelerated by utilizing the analog front end circuit of the automatic sampling clock generation system of the present invention to automatically adjust the sampling clock signal and holding clock signal. At the same time, the effects of external environmental factors, such as temperature, voltage . . . etc. on the image sensor can be overcome, and the reliability of the system is also increased.

With the example and explanations above, the features and spirits of the invention will be hopefully well described.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A clock generation system for automatically generating a sampling signal and a holding signal to an analog front end circuit, the analog front end circuit transforming an analog signal outputted from an image sensor into a digital signal according to the sampling signal and the holding signal, the clock generation system comprising:

a clock generator generating a plurality of clock signals according to a reference signal; and a comparing module receiving the plurality of clock signals, the comparing module comparing the analog signal with a first level signal generated by the image sensor and outputting a first comparison signal to the clock generator, the comparing module further comparing the digital signal with a second level signal and outputting a second comparison signal to the clock generator;

wherein the clock generator selectively outputs a first clock signal, corresponding to the first comparison signal, of the plurality of clock signals as the sampling signal when the first comparison signal received by the clock generator is at a high state, the clock generator further selectively outputs a second clock signal, corresponding to the second comparison signal, of the plurality of clock signals as the holding signal when the second comparison signal received by the clock generator is at the high state.

2. The clock generation system of claim 1, the clock generator comprising:

a delay locked loop generating a plurality of delay signals according to the reference signal; and a controller generating the plurality of clock signals according to the reference signal and the plurality of delay signals;

wherein the controller selectively outputs the first clock signal as the sampling signal when the first comparison signal received by the controller is at the high state, the controller further selectively outputs the second clock signal as the holding signal when the second comparison signal received by the controller is at the high state.

3. The clock generation system of claim 2, wherein the period of the reference signal is the same as the period of each of the plurality of delay signals, and there exists a predetermined phase difference between each of the plurality of delay signals and the reference signal.

4. The clock generation system of claim 2, wherein the controller generates the plurality of clock signals by a logic operation of the reference signal and the plurality of delay signals.

5. The clock generation system of claim 2, wherein there is a different phase value between a first clock signal and a second clock signal of the plurality of clock signals.

6. The clock generation system of claim 1, wherein the first level signal is a DC level signal generated by the image sensor.

7. The clock generation system of claim 1, wherein the second level signal is a digital level signal corresponding to a black pixel of the image sensor.

8. The clock generation system of claim 1, wherein the second level signal is a digital level signal corresponding to a dummy pixel of the image sensor.

9. The clock generation system of claim 1, the analog front end circuit comprising:
- a correlated double sampling circuit generating a processing signal according to the analog signal outputted by the image sensor, the sampling signal, and the holding signal;
- a variable-gain amplifier amplifying the processing signal and generating an amplification gain signal; and
- an analog/digital converter receiving the amplification gain signal and transforming the amplification gain signal into the digital signal.

10. A clock generation method for automatically outputting a sampling signal and a holding signal to an analog front end circuit, the analog front end circuit transforming an analog signal outputted by an image sensor into a digital signal according to the sampling signal and the holding signal, the clock generation method comprising the steps of:
- (a) generating a plurality of clock signals by a clock generator according to a reference signal;
- (b) comparing the analog signal with a first level signal generated by the image sensor according to the plurality of clock signals and outputting a first comparison signal to the clock generator; and
- (c) comparing the digital signal with a second level signal according to the plurality of clock signals and outputting a second comparison signal to the clock generator;

wherein a first clock signal, corresponding to the first comparison signal, is selected from the plurality of clock signals as the sampling signal when the first comparison signal is at a high state, and a second clock signal, corresponding to the second comparison signal, is selected from the plurality of clock signals as the holding signal when the second comparison signal is at the high state.

11. The clock generation method of claim 10, step (a) comprising:
- (a1) generating a plurality of delay signals according to the reference signal; and
- (a2) generating the plurality of clock signals according to the reference signal and the plurality of delay signals.

12. The clock generation method of claim 11, wherein the period of the reference signal is the same as the period of each of the plurality of delay signals, and there is a predetermined phase difference between each of the plurality of delay signals and the reference signal.

13. The clock generation method of claim 11, wherein the plurality of clock signals are generated by a logic operation of the reference signal and the plurality of delay signals.

14. The clock generation method of claim 11, wherein there is a different phase value between a first clock signal and a second clock signal of the plurality of clock signals.

15. The clock generation method of claim 10, wherein the first level signal is a DC level signal generated by the image sensor.

16. The clock generation method of claim 10, wherein the second level signal is a digital level signal corresponding to a black pixel of the image sensor.

17. The clock generation method of claim 10, wherein the second level signal is a digital level signal corresponding to a dummy pixel of the image sensor.

* * * * *